United States Patent
Godin et al.

(10) Patent No.: US 7,620,760 B2
(45) Date of Patent: Nov. 17, 2009

(54) NON-HIGH IMPEDENCE DEVICE AND METHOD FOR REDUCING ENERGY CONSUMPTION

(75) Inventors: Kostantin Godin, Herzliya (IL); Moshe Anschel, Kfar Saba (IL); Yacov Efrat, Kfar Saba (IL); Leonid Rabinovich, Richon Le Zion (IL); Noam Sivan, Ganei Tikva (IL); Eitan Zmora, Jerusalem (IL); Ziv Zamsky, Ra'Anana (IL)

(73) Assignee: Freescale Semiconductor, Inc., Austin, TX (US)

( * ) Notice: Subject to any disclaimer, the term of this patent is extended or adjusted under 35 U.S.C. 154(b) by 126 days.

(21) Appl. No.: 11/815,189

(22) PCT Filed: Feb. 7, 2005

(86) PCT No.: PCT/IB2005/000232

§ 371 (c)(1),
(2), (4) Date: Jul. 31, 2007

(87) PCT Pub. No.: WO2006/082458

PCT Pub. Date: Aug. 10, 2006

(65) Prior Publication Data

US 2008/0140894 A1    Jun. 12, 2008

(51) Int. Cl.
*G06F 13/36* (2006.01)

(52) U.S. Cl. ...................... 710/113; 710/240

(58) Field of Classification Search .................. 710/113, 710/117, 124, 240, 241; 327/19
See application file for complete search history.

(56) References Cited

U.S. PATENT DOCUMENTS

| | | | | |
|---|---|---|---|---|
| 4,375,639 | A | * | 3/1983 | Johnson, Jr. ................ 710/114 |
| 4,641,266 | A | * | 2/1987 | Walsh ......................... 710/111 |
| 5,148,112 | A | * | 9/1992 | Gahan .......................... 327/19 |
| 5,274,785 | A | * | 12/1993 | Kuddes et al. .............. 710/111 |
| 5,276,886 | A | * | 1/1994 | Dror ............................ 710/240 |
| 5,555,382 | A | * | 9/1996 | Thaller et al. ............... 710/113 |
| 5,623,672 | A | * | 4/1997 | Popat .......................... 710/240 |
| 5,692,202 | A | * | 11/1997 | Kardach et al. ............. 713/324 |
| 5,875,339 | A | * | 2/1999 | Molnar et al. ............... 710/240 |
| 6,112,016 | A | * | 8/2000 | MacWilliams et al. ...... 710/107 |
| 6,865,635 | B1 | * | 3/2005 | Nouvet et al. ............... 710/244 |
| 2002/0083241 | A1 | | 6/2002 | Moller |
| 2002/0166074 | A1 | | 11/2002 | Cheung et al. |
| 2004/0123005 | A1 | * | 6/2004 | Stuber et al. ................ 710/107 |

* cited by examiner

*Primary Examiner*—Khanh Dang

(57) ABSTRACT

A device that includes: a first bus, connected between a first logic and a first circuit; a group of second buses connected between the first logic and between multiple non-high impedance circuit access logics associated with multiple circuits; wherein each circuit access logic is adapted to: (i) provide to the first logic, a circuit write value during a circuit writing period and during an idle period that follows the circuit writing period and ends when another circuit is allowed to write; and (ii) provide a default value when another circuit is allowed to write; and wherein the first logic is adapted to alter a state of the first bus in response to a change between two consecutive circuit write values.

17 Claims, 5 Drawing Sheets

NON-HIGH IMPEDENCE DEVICE AND METHOD FOR REDUCING ENERGY CONSUMPTION

FIELD OF THE INVENTION

The present invention relates to non-high impedance devices and methods for reducing energy consumption.

BACKGROUND OF THE INVENTION

There is a growing need to reduce the power consumption of static devices and especially of mobile devices. Mobile devices can include, for example, personal data appliances, cellular phones, radios, pagers, lap top computers, and the like. The power consumption of mobile devices is critical as they are usually supposed to operate for relatively long periods before being recharged.

Typical devices have multiple circuits such as processors, controllers, memory units, peripherals and the like. Typically, many circuits are interconnected to each other by a central bus.

When multiple circuits are connected to the same bus each circuit can access the bus, according to a media access control scheme. A device that is allowed to access the bus can write a certain circuit writing value that propagates over the bus.

There is a need to assure that the circuit writing value properly propagates along the bus and is not affected by the output of other circuits. In order to satisfy this need various techniques were developed. These techniques include a "return to zero" and a "return to one" policies that force a circuit to provide a zero or one value when it ends its writing session.

It is known that frequent changes of bus states is energy consuming. Each change in the bus state requires the writing circuit to charge (or discharge) various bus capacitances. Both the return to zero and return to one policies involve multiple bus changes.

High impedance architectures allow circuits to enter a high impedance state and not to affect the bus state during idle periods. High impedance devices have various drawbacks such as larger silicon footprint, testing problems, introduce difficulties in insertion of repeaters, and the like. Some of the drawbacks are illustrated in U.S. patent application 2002/0166074 of Cheung et al.

There is a need to provide an efficient manner to decrease the energy consumption of integrated circuits.

SUMMARY OF THE PRESENT INVENTION

A method an apparatus for reducing energy consumption of a non-high impedance device, as described in the accompanying claims.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

The following description refers to non-high impedance devices that do not allow a high-impedance state. Thus, a component that is connected to a bus has to provide a valid value and is not allowed to virtually disconnect from the bus by providing a high impedance output. Conveniently, a valid value of a certain bit can be either high or low, but this is not necessarily so.

The energy consumption can be decreased, and in some cases be dramatically decreased by limiting the amount of bus state changes. The amount of energy reduction is usually responsive to various parameters the structure of the device and the frequency of data transfers over the buses of the device.

Figure 1:
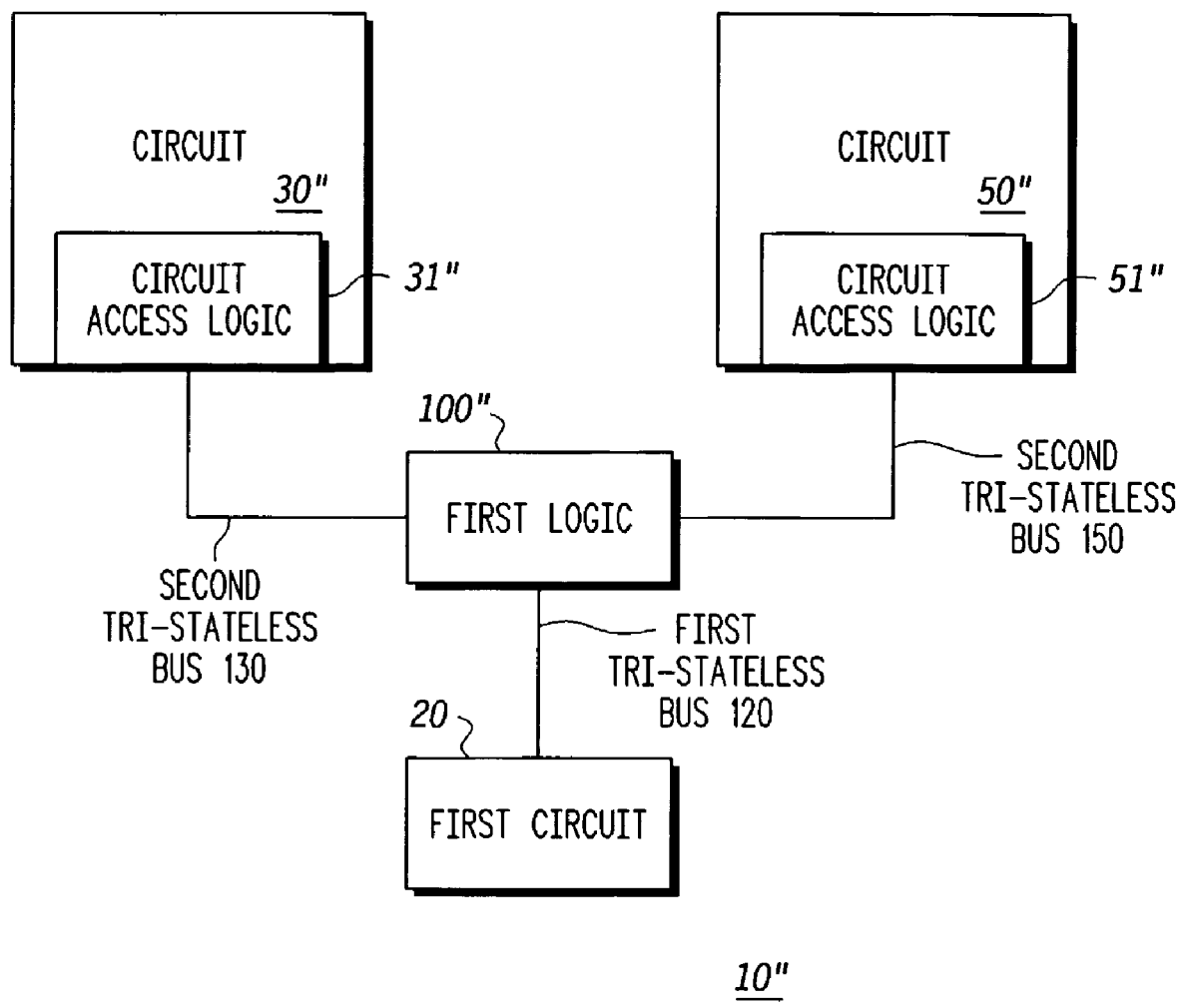
FIG. 1 is a schematic illustration of a device according to an embodiment of the invention.
Figure 2:
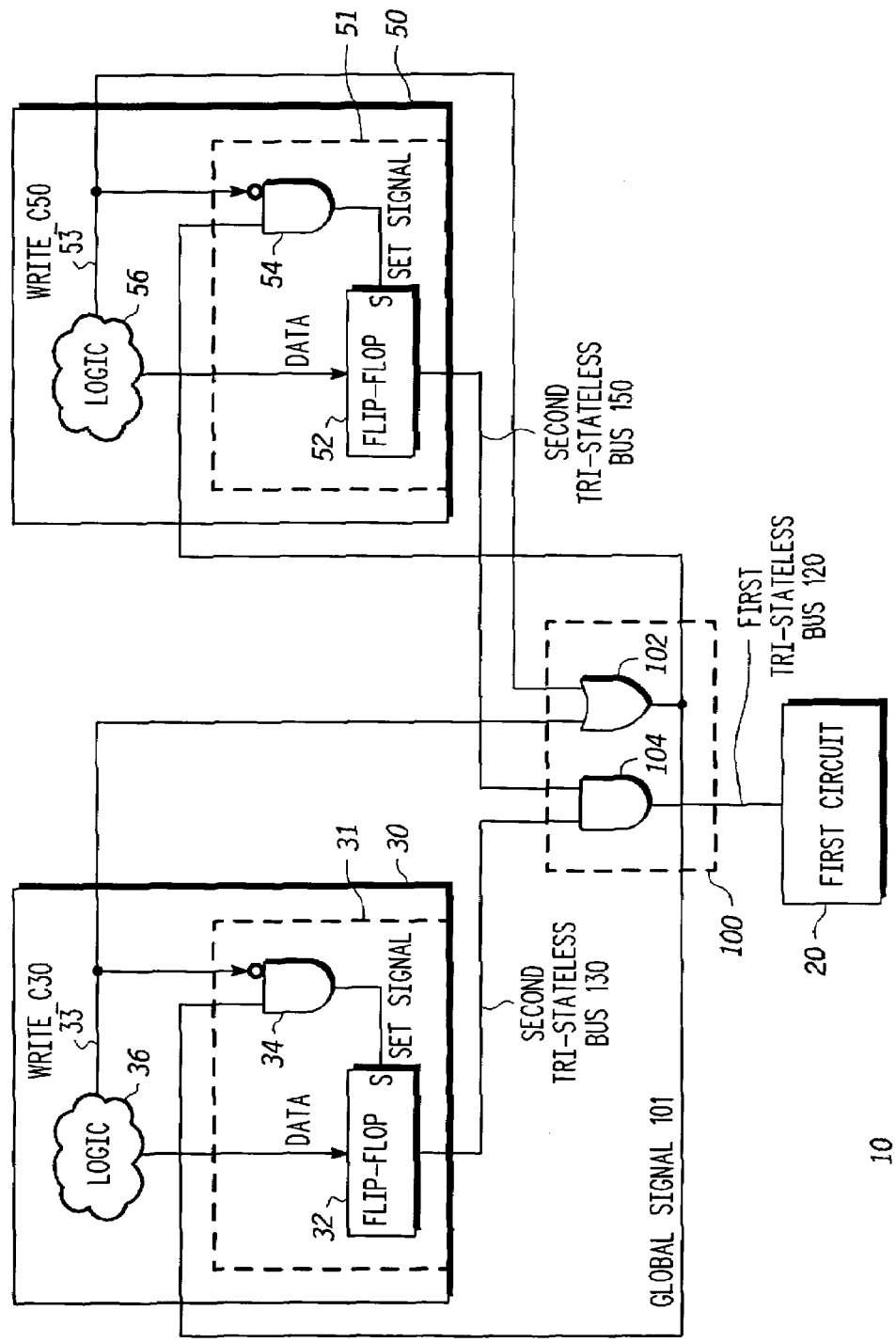
FIG. 2 is a schematic illustration of a device according to an embodiment of the invention.
Figure 3:
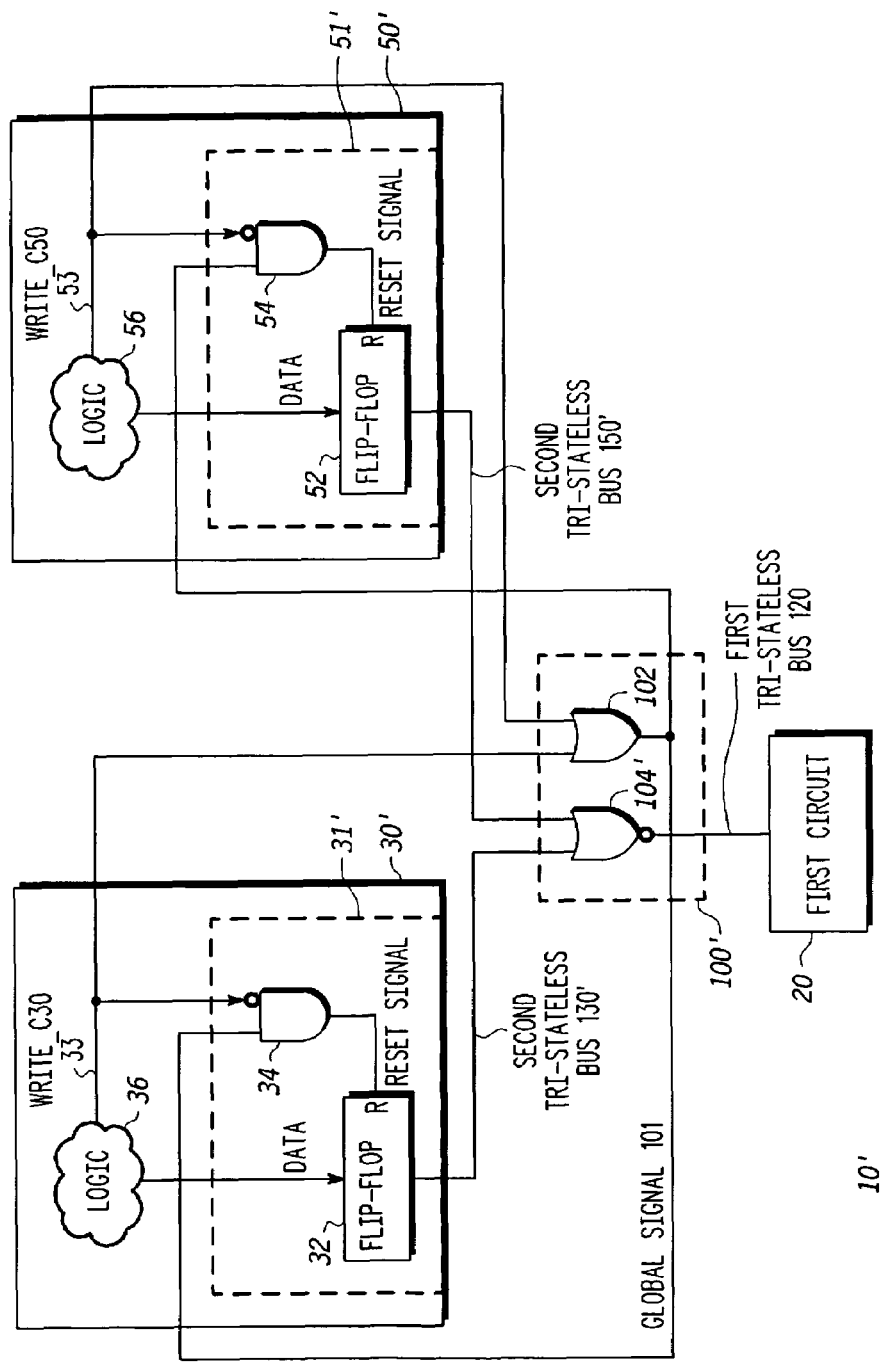
FIG. 3 is a schematic illustration of a device according to another embodiment of the invention.

FIG. 1 illustrates device 10" according to an embodiment of the invention. FIG. 2 illustrates device 10 according to an embodiment of the invention. FIG. 3 illustrates device 10' according to another embodiment of the invention.

Device 10" includes multiple circuits, such as circuits 30" and 50", each having a circuit control logic. Circuits 30" and 50" are connected to a first logic 100" by busses 130 and 150. The first logic 100" is connected to a first circuit 20 by a first bus 120. Each circuit out of 30" and 50" has a corresponding circuit access logic 31" and 51" that is adapted to provide to the first logic 100", a circuit write value. The circuit write value is provided during a circuit writing period and during an idle period that follows the circuit writing period. This idle period ends when another circuit is allowed to write. Each of circuits 30" and 50" provides a default value when another circuit is allowed to write.

The first logic 100" is adapted to alter a state of the first bus 120 in response to a change between two consecutive circuit write values. It is noted that each of the circuit access logics 31" and 51" receives a global signal that indicates whether another circuit is writing to the first logic 100".

It is noted that a circuit write value can include multiple signals.

The inventors applied the discloses method and devices in a pipelined environment in which a typical writing operation occurs each few clock cycles. According to other embodiments of the invention the devices and method can be applied in other environments including a zero wait state environments.

Device 10 of FIG. 2 differs from device 10' of FIG. 3 by having different circuit default values (which is a string of "1" instead a string of "0") and by having a first logic that includes AND gates instead of the NOR gates of device 10'.

Device 10 includes a first circuit 20 and multiple circuits that are denoted 30 and 50. Typically, the device includes more than two circuits 30 and 50 but for convenience of explanation only two circuits 30 and 50 are shown. Conveniently, first circuit 20 is a processor, that can be a digital signal processor, a general purpose processor or a combination of both. Conveniently, the multiple circuits 30 and 50 either memory units, peripherals, memory access controllers and the like.

Conveniently, the first circuit 20 controls the access of the multiple circuits 30 and 50 to him. There are various manners to control this access. For example, the first circuit 20 can use an address based access control in which the first circuit 20 sends that address of the circuit (30 or 50) that can access him via an address bus or other buses that are not shown in FIG. 2, for convenience of explanation. It is noted that other access control schemes can be used.

The multiple circuits 30 and 50 are connected, via circuit access units 31 and 51 and via multiple second buses 130 and 150 to a first logic 100. The first logic 100 is connected to the first circuit 20 via a first bus 120.

Conveniently, each circuit access logic is included within the associated circuit, but this is not necessarily so.

Each circuit access logic is adapted to provide to the first logic 100 a circuit write value when a circuit associated with the circuit access logic is allowed to write. Each circuit access logic is further adapted to provide a default value when another circuit is allowed to write.

The first logic 100 is adapted to alter a state of the first bus 120 in response to a change between two consecutive circuit write values.

According to an embodiment of the invention each of the circuit access logics 31 and 51 is responsive to a global signal 101 representative of a writing activity of at least one circuit out of the multiple circuits 30, 50.

The global signal 101 is generated by the first logic 100 that applied an OR operation, by OR gate 102, on each of a circuit writing signal (33 and 53) that indicates that a certain circuit is allowed to write to the first logic 100.

According to an embodiment of the invention the default value provided by each circuit is a string of ones ("1"). First logic 100 of FIG. 2 has an array of AND gates, that are collectively denoted 104, that perform a logic AND operation on each bit of the second buses that are connected in parallel to the AND gates 104. Thus, the value on each bit of the first bus is an AND of the values of corresponding bits of all the second buses.

It is noted that the circuit access logics, such as circuit access logics 31, 31', 31", 51, 51' and 51" are non-high impedance logics. They are not allowed to enter a high impedance state. Each circuit access logic has to provide a valid value, whether it is a circuit write value or a default value.

Usually the impedance that can be regarded as high impedance is in the range of hundred thousands ohms and higher. It is noted that a high impedance of a certain device can be defined in response of the impedance of the bus that is connected to that device as well as the impedances of other devices connected to the bus. In a high impedance state a device can be regarded as being virtually disconnected from other devices.

According to anther embodiment of the invention the default value provided by each circuit is a string of zeros ("0"). First logic 100' of FIG. 3 has an array of NOR gates that are collectively denoted 104' that perform a logic NOR operation on each bit of the second buses that are connected in parallel to the NOR gates 104'. Thus, the value on each bit of the first bus is an NOR of the values of corresponding bits of all the second buses.

FIG. 2 illustrates a circuit access logic 31 that includes flip-flop 32 having multiple inputs to receive information to be written by the circuit 30, from various circuit logic that is represented by cloud 36. Flip-flop 32 has a set control input for setting flip-flop 32. If the flip-flop is not set it provides the writing values provided by logic 36. These writing values are sent from first logic 100 to the second bus 130.

Circuit access logic 31 further includes an AND gate 34 that receives as inputs the global signal 101 and an inverted circuit writing signal 31. The output of AND gate 43 is connected to the set control input of the flip-flop 32 such as to set the flip flop 32 (output a string of "1") when another circuit (such as 50) is allowed or after the device is reset.

The circuit access logic 51 of circuit 50 is analogues to circuit access logic 31. It includes a flip-flop 52 and an AND gate 54 that receives the global signal 101 and an inverted circuit signal 51.

Referring to FIG. 3, the first logic 100' includes NOR gates 104' and each circuit access logic 31 and 51 includes a flip-flop 32 and 52 accordingly, that is reset to provide a default value of zeroes.

Figure 4:
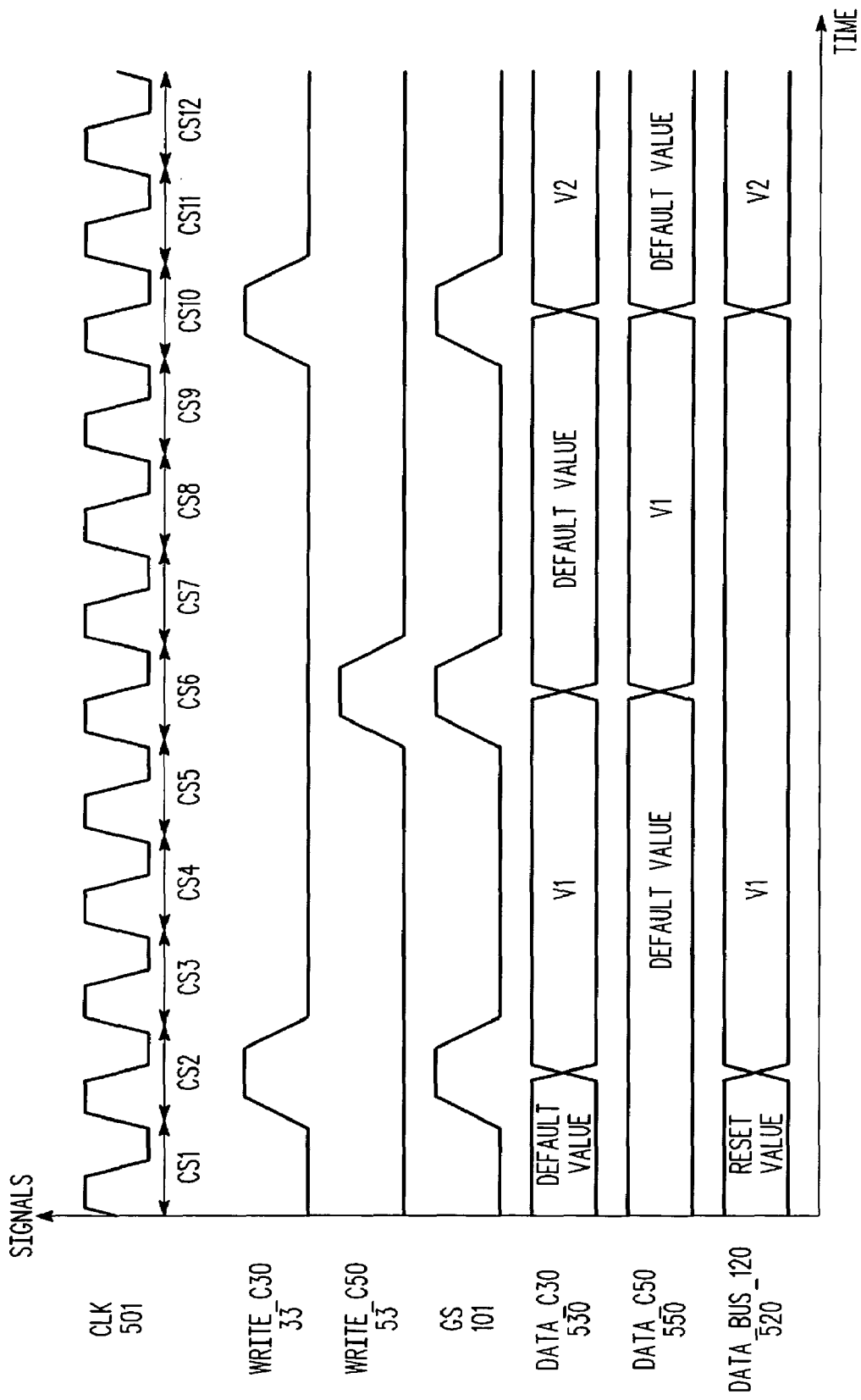
FIG. 4 is a timing diagram of an exemplary write operation, according to an embodiment of the invention.

FIG. 4 is a timing diagram of an exemplary write operation, according to an embodiment of the invention.

For simplicity of explanation the following diagram relates to device 10 of FIG. 2.

The following symbols represent the following signals: CLK 501 represents the clock signal, DATA_C30 530 represents writing values of circuit 30, DATA_C50 550 represents writing values of circuit 50, DATA_BUS_120 520 represents the data on first bus 120, WRITE_C30 33 represents the circuit write signal of circuit 30, WRITE_C50 53 represents the circuit write signal of circuit 30, and GS 101 is the global signal.

Sequential clock cycles are denoted CS1-CS10.

At CS1 device 10 is reset and circuits 30 and 50 provide default values that are strings of "1".

At CS2 circuit 30 is allowed to write. Accordingly, at the beginning of CS2 WRITE_C30 33 is asserted. Global signal 101 is also asserted. At the middle of CS2 circuit 30 writes data to first logic, as indicated by the change in DATA_C30 530. It is assumed that this data (also referred to as circuit writing value) includes a first string having a first string value denoted V1.

At the end of CS2 circuit 30 ends its writing operation. Thus, after CS2 WRITE_C30 33 and global signal 101 are negated and circuit 30 continues to output the first string. The data over first bus 120 does not change. The period that starts after CS2 and end when circuit 50 is allowed to write is viewed by circuit 30 as an idle period.

After few clock cycles, for example, after three clock cycles, at CS6, circuit 50 is allowed to write. Accordingly, WRITE_C50 53 is asserted, global signal 101 is asserted, DATA_C30 530 equals a string of "1" and DATA_C50 550 equals a second string that has a first value V1. Because the first and second strings have the same value V1 the state of first bus 120 does not change.

At the end of CS6 circuit 50 ends its writing operation. Thus, after CS6 WRITE_C50 53 and global signal 101 are negated thus circuit 50 continues to output the second string and the data over first bus 120 does not change. The period that starts after CS6 and ends when another circuit (or even circuit 50) is allowed to write is viewed by circuit 50 as an idle period. After few clock cycles, for example, after three clock cycles, at CS10, circuit 30 is allowed to write a third string having a third value V2. Accordingly the state of the first bus 120 changes.

It is noted that an idle period can be defined as a period during which neither one of the devices is allowed to write to the first logic 100.

Figure 5:
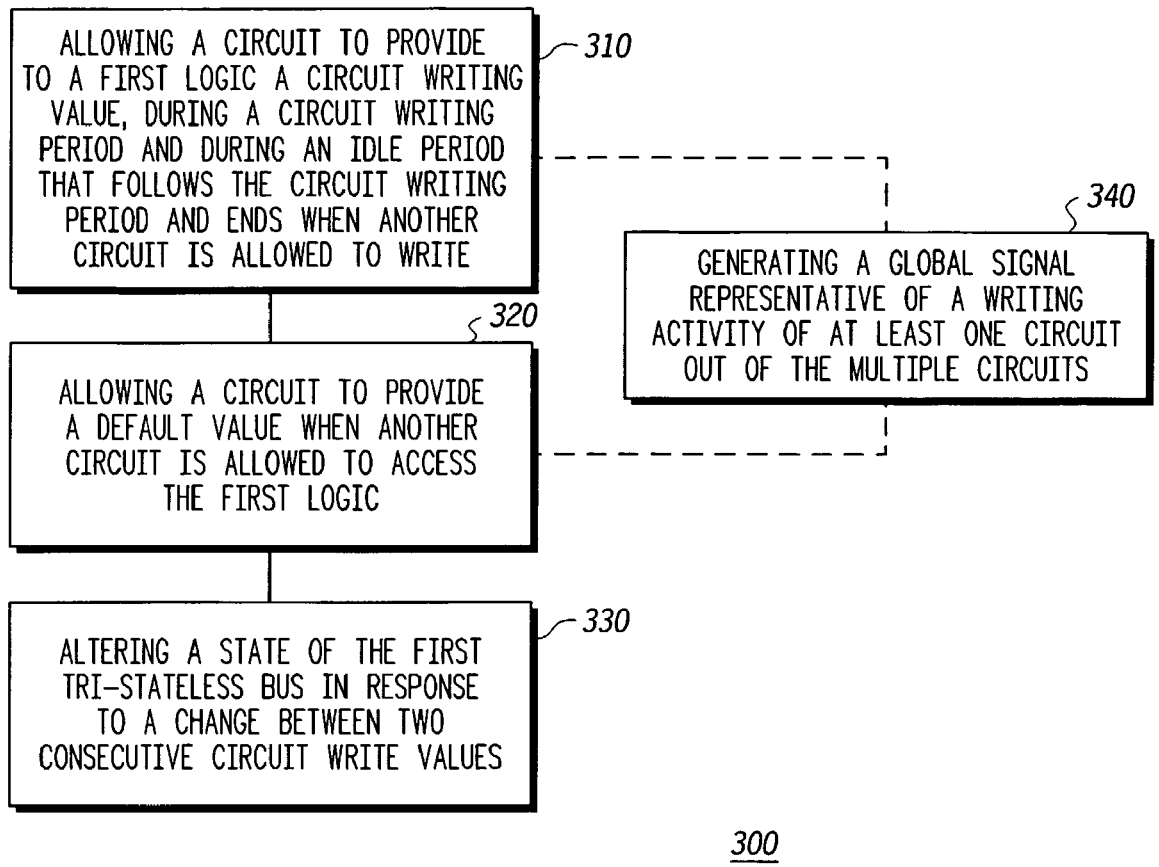
FIG. 5 is a flow chart of a method for reducing energy consumption, according to an embodiment of the invention.

FIG. 5 is a flow chart of method 300 for altering a state of a first bus, according to an embodiment of the invention.

Method 300 starts by stage 310 of allowing a non-high impedance circuit to provide to a first logic a circuit writing value, during a circuit writing period and during an idle period that follows the circuit writing period and ends when another circuit is allowed to write. The non-high impedance circuit does not enter a high impedance state.

Stage 310 usually includes the actual provision of the circuit writing value over a second bus to the first logic. Conveniently, once a circuit is allowed to access the first logic it asserts a circuit writing signal indicating that that circuit is writing to the first logic or is going to write to the first logic.

Stage 310 is followed by stage 320 of allowing a circuit to provide a default value when another circuit is allowed to access the first logic.

Stage 320 is followed by stage 330 of altering a state of the first bus in response to a change between two consecutive circuit write values. Each circuit comprises a non-high impedance circuit access logic. It is noted that stage 330 can occurs in parallel to stages 310 and 320.

Conveniently, method 300 includes generating (stage 340) a global signal representative of a writing activity 30 of at least one circuit out of the multiple circuits. According to an embodiment of the invention this global signal is responsive to circuit writing signals asserted by any one of the circuits that can access the first logic.

Conveniently, the method 300 includes a preliminary stage (not shown) of controlling access to the first logic by the first circuit.

Conveniently, the default value is a string of "1" and method 300 includes performing a series of AND operations, by the first logic, in order to determine the state of the first bus.

Conveniently, the default value is a string of "0" and method 300 includes performing, by the first logic, a series of NOR operations in order to determine the state of the first bus.

Conveniently, stage 320 includes setting or resetting a circuit of a circuit access logic. Conveniently, that circuit is a flip-flop that is also adapted to bypass data provided from the circuit to the first logic.

It is noted that FIGS. 1-3 illustrate a device that includes a central first logic that is connected between multiple second buses and a first bus. It is noted that the invention can be applied in more complex architectures that include multiple first logic, either of the same level or belonging to multiple levels.

It is further noted that a first circuit can also include a circuit access logic that can be used, for example, when it access the bus and especially when another circuit controls the access to the first logic. In such cases the first circuit can be connected to another logic, analogues to the first logic, which controls the access to other buses and devices.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. A device comprising:
   a first circuit, a first bus, and multiple circuits;
   a first logic coupled to the first bus, and to multiple non-high impedance circuit access logics associated with multiple circuits; wherein each circuit access logic is adapted to:
   (i) provide to the first logic, a circuit write value during a circuit writing period and during an idle period that follows the circuit writing period and ends when another circuit is allowed to write; and
   (ii) provide a default value when another circuit is allowed to write; and wherein the first logic is adapted to alter a state of the first bus in response to a change between two consecutive circuit write values.

2. The device according to claim 1 wherein the circuit access logics are responsive to a global signal representative of a writing activity of at least one circuit out of the multiple circuits.

3. The device according to claim 1 wherein the first circuit is adapted to control access of the multiple circuits to the first logic.

4. The device according to claim 1 wherein the default value is a string of "1" and wherein the first logic comprises multiple AND gates that are coupled to the first bus.

5. The device according to claim 1 wherein the default value is a string of "1" and wherein the circuit access logics comprise a logic circuit that is set during a circuit default period.

6. The device according to claim 1 wherein the default value is a string of "0" and wherein the first logic comprises multiple NOR gates that are coupled to the first bus.

7. The device according to claim 1 wherein the default value is a string of "0" and wherein the circuit access logics comprise a logic circuit that is reset to provide a default value.

8. The device according to claim 1 wherein each circuit access logic comprises a first AND gate having two inputs and an output, and wherein the first AND gate sends a control signal when a global signal indicates that another circuit is writing, when the certain circuit does not write or when both occur.

9. The device according to claim 1 wherein each circuit is adapted to generate a circuit writing signal representative of a writing sequence performed by that circuit.

10. The device according to claim 1 wherein a circuit access logic comprises:
    a flip-flop having multiple inputs to receive information to be written by the circuit and a control input for selectively forcing the flip-flop to output a default value or to output a circuit writing value;
    at least one logic gate, coupled to the control input of the flip-flop, adapted to receive an indication about a writing status of the circuit and an indication of the writing status of other circuits and in response determine a control signal sent to the control input.

11. A method for altering a state of a first bus, the method comprises:
    allowing a circuit to provide a default value when another circuit is allowed to access the first logic;
    allowing a non-high impedance circuit to provide to a first logic a circuit writing value, during a circuit writing period and during an idle period that follows the circuit writing period and ends when another circuit is allowed to write; and
    altering a state of the first bus in response to a change between two consecutive circuit write values; wherein each circuit comprises a tri-stateless circuit access logic.

12. The method according to claim 11 further comprising generating a global signal representative of a writing activity of at least one circuit out of the multiple circuits.

13. The method according to claim 11 further comprising controlling access to the first logic by the first circuit.

14. The method according to claim 11 wherein the default value is a string of "1" and wherein the method comprises performing a series of AND operations in order to determine the state of the first bus.

15. The method according to claim 11 wherein the default value is a string of "0" and wherein the method comprises performing a series of NOR operations in order to determine the state of the first bus.

16. The method according to claim 11 wherein the stage of allowing a circuit to provide a default value comprises setting or resetting a circuit of a circuit access logic.

17. The method of claim 16 wherein the circuit is a flip-flop that is also adapted to bypass data provided from the circuit to the first logic.

* * * * *